United States Patent
Cote et al.

(10) Patent No.: US 7,567,090 B2
(45) Date of Patent: Jul. 28, 2009

(54) LIQUID RECOVERY, COLLECTION METHOD AND APPARATUS IN A NON-RECIRCULATING TEST AND BURN-IN APPLICATION

(75) Inventors: Normand Cote, Granby (CA); Peter J. Demko, Essex Junction, VT (US); David L. Gardell, Fairfax, VT (US); Jeffrey D. Gelorme, Burlington, CT (US); Marc D. Knox, Hinesburg, VT (US); George J. Lawson, Barre, VT (US); Kathryn C. Rivera, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 365 days.

(21) Appl. No.: 11/551,735

(22) Filed: Oct. 23, 2006

(65) Prior Publication Data

US 2008/0116921 A1 May 22, 2008

(51) Int. Cl.
*G01R 31/02* (2006.01)
(52) U.S. Cl. .................. 324/760; 324/765; 165/80.4
(58) Field of Classification Search .................. None
See application file for complete search history.

(56) References Cited

U.S. PATENT DOCUMENTS

| | | | |
|---|---|---|---|
| 4,561,040 A | | 12/1985 | Eastman et al. |
| 4,928,207 A | * | 5/1990 | Chrysler et al. ............. 361/700 |
| 5,514,906 A | | 5/1996 | Love et al. |
| 5,901,037 A | | 5/1999 | Hamilton et al. |
| 6,650,542 B1 | * | 11/2003 | Chrysler et al. ............. 361/699 |
| 6,892,796 B1 | | 5/2005 | Nagashima et al. |
| 6,952,346 B2 | * | 10/2005 | Tilton et al. ................. 361/699 |
| 7,215,547 B2 | * | 5/2007 | Chang et al. ................ 361/701 |
| 2005/0067143 A1 | | 3/2005 | Huang et al. |
| 2005/0117300 A1 | | 6/2005 | Prasher et al. |
| 2005/0224212 A1 | | 10/2005 | East |

* cited by examiner

*Primary Examiner*—Minh N Tang
(74) *Attorney, Agent, or Firm*—Patrick J. Daugherty; Driggs, Hogg, Daugherty & Del Zoppo Co., LPA

(57) ABSTRACT

A heat sink for use in the burn-in of an I/C chip, which chip has a generally "flat" surface. The heat sink has a "flat" surface with micro-channels therein, positioned to open and close in and out of contact against the flat surface of an I/C chip being burned-in. At least one liquid opening communicates with said essentially flat surface on the heat sink to continuously apply liquid between the heat sink and the chip. A liquid inlet is provided to supply liquid to said at least one liquid opening. A recovery channel is positioned to recover liquid from between the heat sink and the chip, and an exhaust member is provided to carry liquid from said recovery channel to the exterior of the heat sink. The invention also includes a method of burning-in a chip.

20 Claims, 3 Drawing Sheets

LIQUID RECOVERY, COLLECTION METHOD AND APPARATUS IN A NON-RECIRCULATING TEST AND BURN-IN APPLICATION

FIELD OF THE INVENTION

This invention relates generally to the testing of electronic components, such as chips, for functional reliability prior to assembly, by such procedures as burn-in and, in particular, to a device for and method of burning-in of electronic devices, such as chips.

BACKGROUND INFORMATION

Continued emphasis in the semiconductor industry on producing smaller processor integrated circuits (I/C's) by making all of the circuits smaller and denser is ever driving increasing power requirements. The increased power consumption results in more heat generated by the I/C as it is operating and the need to control/stabilize I/C temperature during the test and burn-in processes. Generally, the I/C is contacted by a heat sink to control temperature during burn in. High performance heat sinks are well known in the prior art. They are typically liquid cooled and may also incorporate additional control features, such as temperature sensors, heaters, thermoelectric devices and fluid control valves. The shape and size of the liquid cooling passages are optimized for heat transfer. The heat sink is a part of the burn-in oven. The state of the art of heat sink design is such that the biggest limitation to temperature control is transferring the heat from the IC to the heat sink. The thermal interface between the I/C and heat sink must be high performance and temporary so the heat sink can be removed from the I/C after test. Known thermal interface methods are: (1) minimum tolerance surface flatness of heat exchanger and coplanarity between an I/C and heat exchanger (which still results in a microscopic air gap between the I/C/heat exchanger surfaces); (2) continuous injection of an inert gas (example—helium) to fill the air gap between the I/C heat exchanger surfaces; (3) placing a compliant material (example—Egraf) with high thermal conductivity on the heat exchanger surface that contacts the I/C to enable thermal control of the I/C under test and burn-in conditions; (4) remote/external dispense of a liquid (with a higher viscosity than water) for maximum effective heat transfer applications. Methods 1, 2 and 3 do not provide the level of thermal transfer that can be accomplished with method 4 required for current/future generations of processor I/C's. Method 4 does support current/future power dissipation requirements but the external/remote liquid dispense method leaves the end-user with the liquid in a static condition and prone to liquid breakdown and residual build-up which lessens liquid thermal performance and power dissipation significantly below that required, resulting in inadequate test or false fails.

The breakdown of liquid and residual build-up affects thermal performance and reliability of the test or burn-in (B/I) tooling, resulting in more frequent tool cleaning and heat exchanger replacement, driving significant increase in cost of ownership (COO).

The contamination on the I/C backside is a paramount concern as (a) if it is not detected and removed, the contamination adversely affects long term reliability of the thermal solution incorporated into the final I/C package assembly, resulting in premature I/C failure; (b) increased COO to implement an inspection/detection process resulting in yield loss if contamination removal is not possible, and (c) increased COO to develop/implement an inspect/detect/contamination removal process, resulting in revenue/profit impact. This is all explained in some detail in patent application Ser. No. 11/330,922, filed Jan. 12, 2006, entitled "Enhanced Thermo-Oxidative Stability Thermal Interface Compositions and Use Thereof in Microelectronics Assembly", which is incorporated herein by reference.

Thus, it is desired that an improved technique for burn-in of electronic devices, such as chips, be developed that overcomes these defects.

SUMMARY OF THE INVENTION

A heat sink for use in the burn-in of an I/C chip, which chip has a generally flat surface. The flat surface of the I/C chip being burned-in is positioned in contact with the flat heat sink surface so at least one supply liquid opening communicates with said essentially flat surface on the heat sink to apply liquid between the heat sink and the chip. A recovery channel is positioned to recover liquid from between the heat sink and the chip, and an exhaust member is provided to carry liquid from said recovery channel to the exterior of the heat sink. Micro-channels in the flat surface of the heat sink connect to the liquid opening(s). The micro-channels are covered or closed when the I/C chip is brought into contact with the heat sink. The invention also contemplates a method of burning-in a chip including the steps of providing a device having a generally flat surface, with micro-channels therein, positioned to open and close in and out of contact against one surface of an I/C chip being burned-in; providing at least one liquid opening communicating with said essentially flat surface to apply liquid to said essentially flat surface; a liquid inlet to supply liquid to said at least one liquid opening; a recovery channel positioned to recover liquid from said essentially flat surface; an exhaust to carry liquid from said recovery channel to the exterior of the heat sink, and applying a liquid to the interface between the I/C chip and the essentially flat surface of the device when the essentially flat surface and the I/C chip are in contact.

This invention serves to resolve the static condition of the liquid in extended test/burn-in conditions which can result in liquid breakdown resulting in (1) contamination of the I/C backside, (2) degradation of heat transfer capability of the liquid, (3) tool/component performance degradation, and (4) increased heat exchanger cleaning frequency and/or replacement.

It is recognized that the interface liquid serves to improve conduction of heat between the heat sink and I/C. It does not remove significant heat from the heat sink. Removing heat from the heat sink is accomplished by the separate liquid cooling channels within the heat sink which are well known in the prior art. It is also well known in the prior art that the heat sink may include heaters and temperature sensors. In order to make the intent of the invention more clear, some of these well known heat sink features are not included in the drawings.

DESCRIPTION OF THE PREFERRED EMBODIMENT

Figure 1:
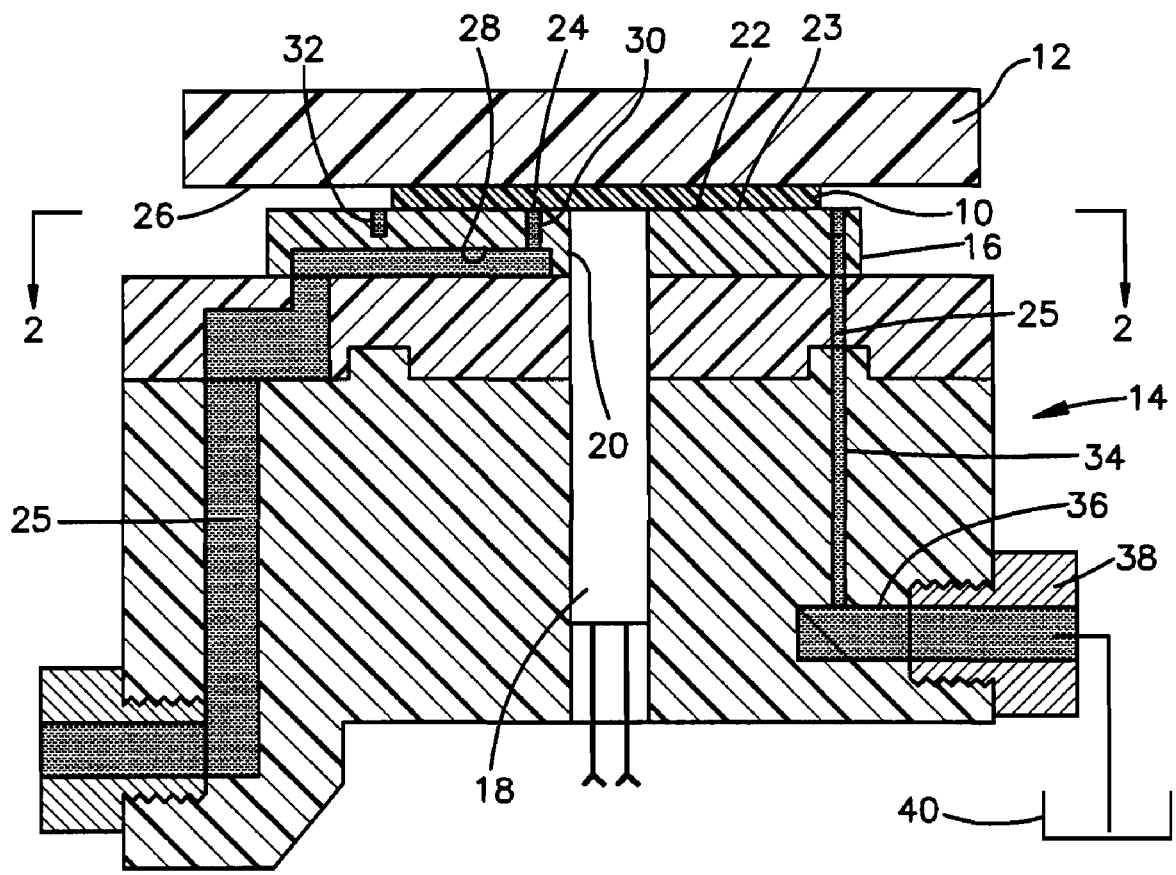
FIG. 1 is a longitudinal sectional exploded view of a device with a chip included of this invention.

This invention, which encompasses a method and apparatus for liquid collection/recovery, enables continuous or dynamic delivery of a liquid to the interface area between an I/C chip and heat exchanger during burn-in, eliminating the static aspect of external/remote dispense and resolves the issues of (1) liquid breakdown, (2) degradation of heat transfer capability of the liquid, (3) tool/component performance degradation, (4) increased COO for tool component cleaning/replacement, and (5) decreased tool life expectancy.

Further, a liquid collection/recovery method and apparatus serves to protect tooling against possible re-condensation/overflow which would result in liquid/tooling performance degradation and decreased tool/component life expectancy. The liquid collection/recovery can be accomplished by integrating a liquid collection technique into a heat exchanger and plumbing to a central collection reservoir. The liquid flow in the collection/recovery system may be enhanced by means of a vacuum-assist or compressed air-assist. Further, the central collection reservoir may have a liquid level alarm incorporated to warn the tooling user of the need to empty the central collection reservoir to prevent tool in operation. Proper disposal/recycling of spent liquid is the responsibility of the tool user.

Additionally, this invention can also facilitate the use of low-viscosity, low cost liquids by enabling increased liquid flow to guard against evaporation, resulting in a depletion of the liquid interface and the corresponding decrease in thermal performance.

Referring now to the drawings, an I/C chip 10 is shown, mounted on a substrate 12. It is to be understood that the mounting of the chip on the substrate is not shown in detail, nor are the connections of the burn-in facility to the substrate shown, nor is the closure member including any operating mechanism for the burn-in tool since they do not constitute a portion of the invention per se.

A burn-in tool 14 is provided having a heat sink 16 with a thermocouple 18 disposed in a central opening 20 extending through a flat surface 22 on heat sink 16. The term "flat" is a relative term since all surfaces have some bumps and valleys thereon. This term is used in the present invention to denote a surface with micro-channels 23 in the surface 22 to allow passage of liquid therethrough while maintaining contact of the liquid with the surface of the chip 10, as will be described presently. The micro-channels may be an artifact of the heat sink polishing process or may be intentionally machined into the surface. The liquid thermal interface will provide a large improvement in thermal contact even with heat sinks that have relatively poor flatness, such as an edge to edge variation of over 80 microns. For the best possible thermal performance, the surface 22 preferably has a variation from edge to edge (in any direction) of no more that four microns, and an Ra surface roughness of 0.5 micron.

Surrounding the opening 20 are a plurality of liquid openings or inlets 24 positioned to provide liquid 25 to the surface 22 in contact with surface 26 of the chip 10, thus providing an interface between the heat sink 16 and the chip 10. Liquid feeds 30 are drilled in the heat sink 16 which communicate with the liquid openings 24, which liquid feeds 30 are connected to a liquid inlet 28 for supplying liquid 25 to openings 24.

Figure 2:
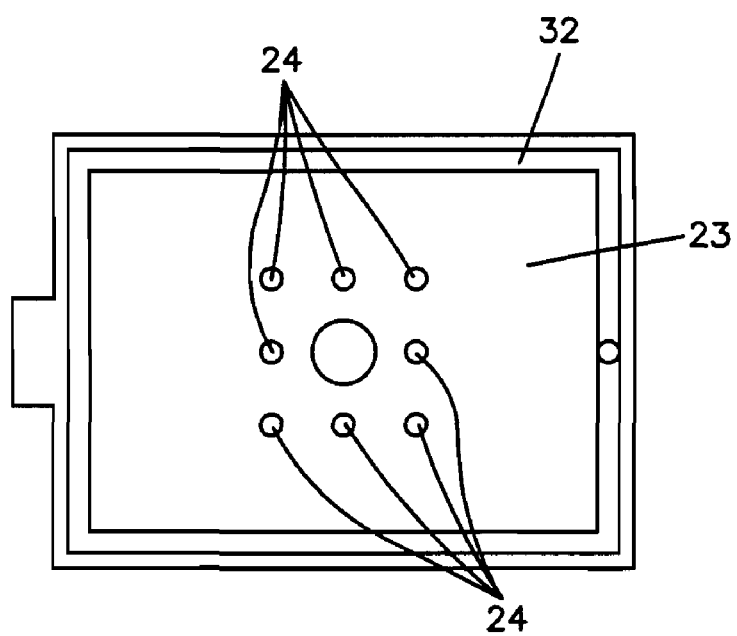
FIG. 2 is a sectional view, somewhat diagrammatic of the present invention, taken substantially along the plane designated by the line 2-2 in FIG. 1.
Figure 3:
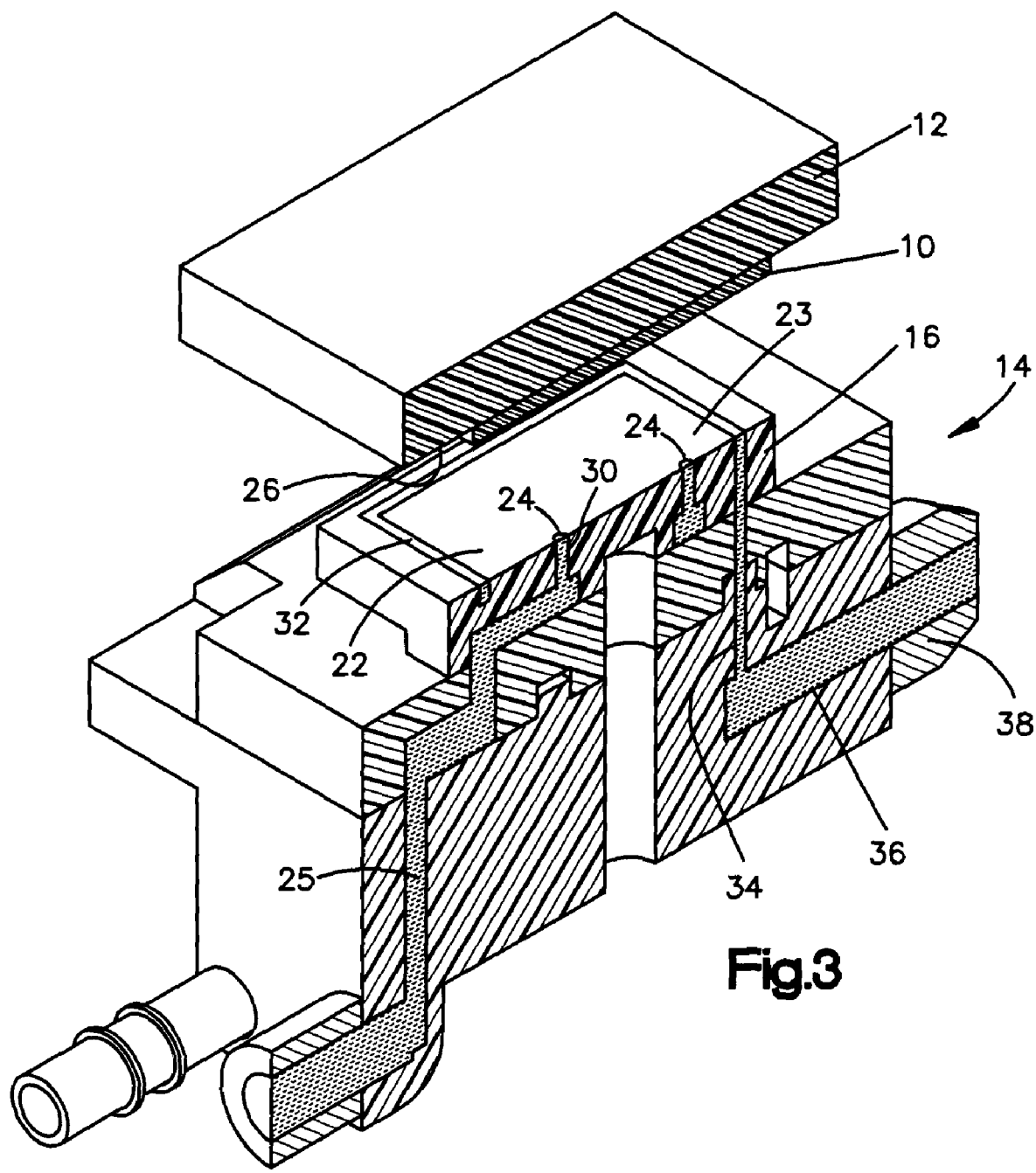
FIG. 3 is a perspective view of the device of this invention with a chip therein.
Figure 4:
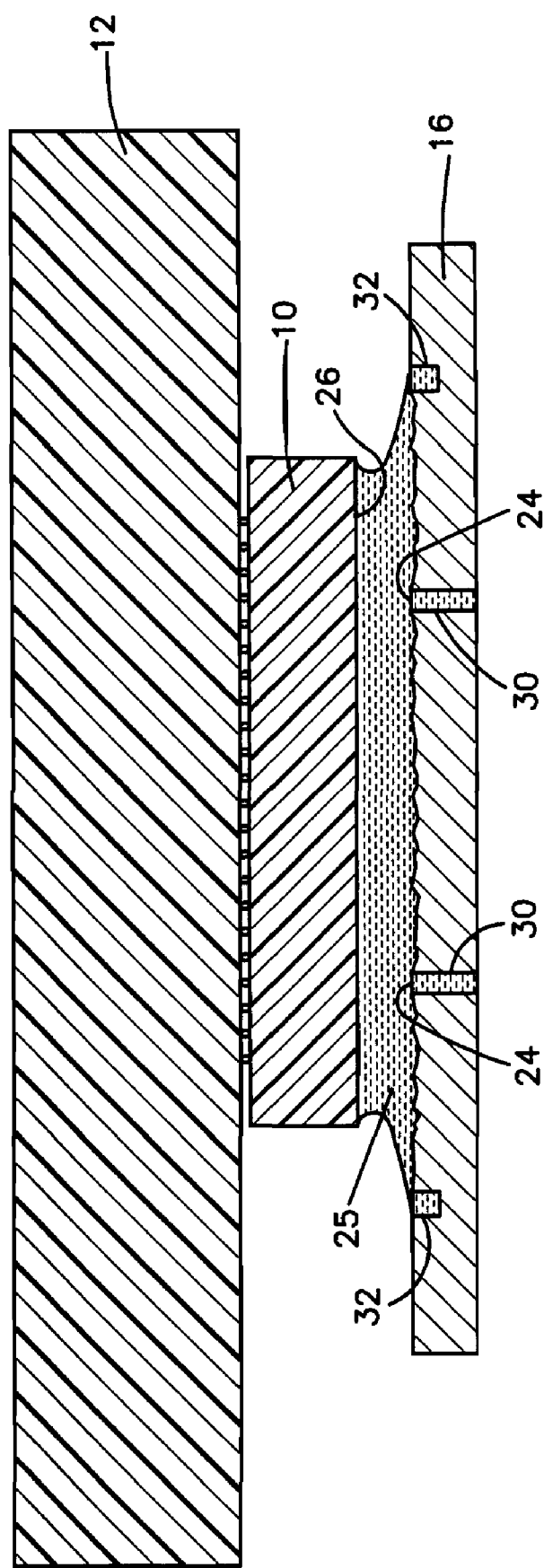
FIG. 4 is a detailed, somewhat diagrammatic, perspective view of the interface between the chip and heat sink.

A liquid collection channel 32 is formed in the surface 22 at a position just at the periphery of where the largest chip 10 would be positioned as shown in FIGS. 1, 2 and 3. One or more liquid recovery or exhaust paths 34 are provided which connect the liquid collection channel 32 to a liquid outlet 36. A vacuum assist 38 or the like, such as compressed air, may be provided in the liquid outlet if desired. Reservoir 40 may be provided to collect the spent liquid and, if desired, the liquid may be recycled.

It is to be understood that surface 26 of the chip is not perfectly smooth, and also contains micro-channels, which together with the micro-channels of the heat sink surface 22 act to channel the liquid.

Operation

In operation, during burn-in, a material, preferably a liquid 25, and more preferably water or synthetic fluids or polyvinyl alcohol (PVA) or mixtures thereof, particularly 50/50 water/PVA, is continuously supplied to the liquid inlet 28, which is transported by the liquid feeds 30 to the liquid openings. Indeed, virtually any liquid 25 can be used if it can flow in the micro-channels on surface 22. The liquid is collected in the channel 32 and delivered through the liquid paths or openings 34 to the reservoir 40. Because of the micro-channels formed in the surface 22, the liquid acts as a heat conductor from the chip 10 to the heat sink 16 during burn-in. If desired, the liquid can be recirculated to the inlet 28. It should be noted that the liquid acts in a dynamic way, as opposed to a static manner as in certain prior art techniques, thus overcoming many of the objections to these prior art techniques. Also, the liquid is delivered to the channel 32, and thence to the reservoir 40 from which it may be recycled.

Liquid heat sink fluid compositions compatible with methods and devices according to the present invention include oil based thermal fluid compositions and, in particular, PAO oils, having enhanced thermo-oxidative stability through incorporation of specially defined oxidation inhibitors/antioxidants and combinations thereof. In contrast to prior art liquid compositions, the compositions and methods of the present invention are found to maintain thermal performance to meet the extended duration requirements for current semiconductor and related microelectronic product programs.

Heat sink fluid composition embodiments according to the present invention comprise a PAO oil base fluid and a hindered phenol primary antioxidant having high molecular weight and low volatility, high melting point/high thermal stability, and in particular, Ethanox® 330, have been found to show major enhancement in oxidative stability. (ETHANOX is a trademark of Albemarle Corporation in the United States or other countries). Likewise, Ethanox® 330 or other suitable hindered phenol such as Irganox® 1010, used in combination with an aromatic phosphite secondary antioxidant such as Ethaphos® 368 show major enhancement in oxidative stability. (IRGANOX is a trademark of Ciba Specialty Chemicals in the United States or other countries; ETHAPHOS is a trademark of Albemarle Corporation in the United States or other countries.) In another aspect, the combination of the above antioxidants selected from hindered phenolic oxidation inhibitors and aromatic phosphites in conjunction with one or more aminic antioxidants, such as alkylated diphenylamine (ADPA) and n-phenyl-1-naphthylamine (PANA), provides LTI compositions with highly desirable properties for applications in even more demanding test & burn-in processes. In a further aspect of the invention, the above compositions can be further modified by the addition of acid scavengers.

Improved performance heat sink fluid compositions of the invention may be prepared by dissolving the high Mw and low volatility antioxidants into the oil, such as polyalphaolefin oil, typically PAO 100, PAO 40 and lower viscosity grades. A polyalphaolefin oil is an oil made by polymerizing an alpha olefin compound having the structure CH2=CHR, wherein R is a linear or cyclic alkyl group. Typically, alpha olefin monomers are propene (R=CH3), butene (R=CH2CH3), 4-methylpentene (R=CH2CH(CH3)2), hexene (R=(CH2)3CH3) and octene (R=(CH2)5CH3). By an alpha olefin polymer is meant an alpha olefin homopolymer or copolymer. Ethene can be used for co-polymerization.

Typical polyalphaolefin oils useful herein because of their demonstrated effectiveness are PAO 100 and PAO 40, which may be defined as high viscosity olefin oligomers manufactured by the Exxon Mobil Corp. and are known as SpectraSyn™ 100 and SpectraSyn™ 40 respectively. (SPECTRASYN is a trademark of Exxon Mobil Corp in the United States or other countries.) SpectraSyn™ 100 basic properties: Kinematic viscosity @ 100° C.=100 cST (centistokes). Molecular weight by GPC approx. 2830 g/mol, pour point=−30° C., acid number=<10 mg KOH/gm. SpectraSyn™ 40 basic properties=kinematic viscosity=39 cSt @ 100° C., Molecular weight by GPC=1680 gm/mol, pour point=−36° C.

Antioxidants used in heat sink fluid according to the present invention may also used in the commercial liquid which comprises PAO 100 and 0.05% Irganox® 1010 and does not interfere with the oxidation inhibitory action of the new antioxidants. In one aspect, new heat sink fluid compositions comprise Ethanox® 330 antioxidant [1,3,5-trimethyl-2,4,6-tris(3,5-di-tert-butyl-4-hydroxybenzyl)benzene] at varying concentrations up to about 2%, or more, preferably 0.16-0.4%, by weight %, in the oil.

In a second aspect, a combination of a hindered phenol such as Ethanox® 330 or Irganox® 1010 with an aromatic phosphite antioxidant such as Ethaphos® 368 [tris(2,4-di-tert-butylphenyl)phosphite] provides excellent results. A diphosphite such as bis-(2,4-tert-butylphenyl)pentaerythritol)diphosphite may also be employed. Typically, the ratio of the phenolic:phosphite in wt % is about 1:1 to 2:1 with total concentration less than about 2%, preferably less than 1% in the oil, typically 0.16-0.4% phenolic and 0.1-0.25% phosphite.

In a third aspect, the new improved performance thermal fluid compositions of the invention comprise a combination of hindered phenolic, phosphite, and aminic antoxidants in the oil. The preferred aminic antioxidants include alkylated diphenyl amine (ADPA), preferably dioctyl diphenylamine and n-phenyl-1-naphthylamine (PANA). The aminic antioxidants are typically in an amount, by weight % in the oil, about 0.05-1%, preferably 0.05-0.15%. In lighter synthetic oil grades, such as PAO 8-25, high mp high Mw antioxidants can be dissolved at higher concentrations but the benefits reach a point of diminishing return beyond a certain point.

While preferred embodiments of the invention have been described herein, variations in the design may be made, and such variations may be apparent to those skilled in the relevant art, as well as to those skilled in other arts. The materials identified above are by no means the only materials suitable for the manufacture of the apparatus, and substitute materials will be readily apparent to one skilled in the art. The scope of the invention, therefore, is only to be limited by the following claims.

What is claimed is:

1. A method for providing a heat sink for use in a burn-in of an integrated circuit chip, comprising:

providing an essentially flat heat sink surface having micro-channels and at least one liquid opening circumscribed by a liquid recovery channel formed in the essentially flat heat sink surface;

wherein the at least one liquid opening is in communication with a liquid feed inlet assembly configured to transport heat sink liquid though the at least one liquid opening and onto said essentially flat heat sink surface and into said micro-channels;

wherein at least one liquid recovery path connects the liquid recovery channel to a liquid outlet;

wherein circumscribing edges formed by the liquid recovery channel define an integrated circuit chip surface interface area on the essentially flat heat sink surface having a height variation of no more than four microns difference in height between opposing edges of the circumscribing edges, the interface area configured to engage an essentially flat surface of an integrated circuit chip comprising micro-channels, the integrated circuit chip surface micro-channels and the interface area surface micro-channels thereby configured to together receive and channel the heat sink liquid transported from the liquid feed inlet assembly through the at least one liquid opening across and into contact with the surface of the integrated circuit and into the liquid recovery channel during a burn-in procedure performed on the integrated circuit chip; and wherein the liquid recovery channel and the at least one liquid recovery path are configured to continuously receive and convey heat sink liquid transported though said at least one liquid opening and channeled across and into contact with the surface of the integrated circuit chip through the integrated circuit chip and interface area micro-channels away from the interface area and to the liquid outlet, the continuously transported heat sink fluid thereby configured to improve conduction of heat between the integrated circuit chip surface and the heat sink surface interface area without static breakdown of the heat sink fluid during the burn-in procedure.

2. The method of claim 1, wherein said heat sink interface area micro-channels are defined by a roughness of the essentially flat heat sink interface surface of about 0.5 micron Ra.

3. The method of claim 2, wherein the liquid feed inlet assembly further comprises an assist element configured to enhance continuous flow of the heat sink liquid transported from the liquid feed inlet assembly through the at least one liquid opening and channeled across and into contact with the surface of the integrated circuit chip though the integrated circuit chip and interface area micro-channels away into the liquid recovery channel and conveyed to the liquid outlet through the at least one liquid recovery path.

4. The method of claim 3, wherein the assist element is a vacuum assist element or a compressed air-assist element.

5. The method of claim 4, wherein the heat sink fluid is chosen from the group consisting of water, a polyvinyl alcohol, and a mixture of water and the polyvinyl alcohol.

6. The method of claim 4 wherein the heat sink fluid is a polyalphaolefin oil comprising a stability-enhancing amount of [1,3,5-trimethyl-2,4,6-tris(3,5-di-tert-butyl-4-hydroxybenzyl)benzene] in an amount of about 0.16 to about 0.4%.

7. The method of claim 6 wherein the heat sink fluid is a combination of a hindered phenol and an aromatic phosphite antioxidant.

8. The method of claim 7 wherein the hindered phenol is [tetrakis-(methylene-3,5-di-tert-butyl-hydroxy-hydrocinnamate)methane]; and wherein the aromatic phosphite is tris(2,4-di-tert-butyl phenyl)phosphate.

9. The method of claim 8 wherein the heat sink fluid further contains an aminic antioxidant.

10. The method of claim 9 wherein the aminic antioxidant is an alkylated amine.

11. A heat sink configured for use in a burn-in of an integrated circuit chip, comprising:
    an essentially flat heat sink surface having micro-channels and at least one liquid opening circumscribed by a liquid recovery channel formed in the essentially flat heat sink surface;
    a liquid feed inlet assembly in communication with the at least one liquid opening and configured to transport heat sink liquid through the at least one liquid opening and onto said essentially flat heat sink surface and into said micro-channels;
    at least one liquid recovery path connecting the liquid recovery channel to a liquid outlet; and
    circumscribing edges formed by the liquid recovery channel defining an integrated circuit chip surface interface area on the essentially flat heat sink surface having a height variation of no more than four microns difference in height between opposing edges of the circumscribing edges, the interface area configured to engage an essentially flat surface of an integrated circuit chip comprising micro-channels, the integrated circuit chip surface micro-channels and the interface area surface micro-channels thereby configured to together receive and channel the heat sink liquid transported from the liquid feed inlet assembly through the at least one liquid opening across and into contact with the surface of the integrated circuit and into the liquid recovery channel during a burn-in procedure performed on the integrated circuit chip;
    wherein the liquid recovery channel and the at least one liquid recovery path are configured to continuously receive and convey heat sink liquid transported though said at least one liquid opening and channeled across and into contact with the surface of the integrated circuit chip though the integrated circuit chip and interface area micro-channels away from the interface area and to the liquid outlet, the continuously transported heat sink fluid thereby configured to improve conduction of heat between the integrated circuit chip surface and the heat sink surface interface area without static breakdown of the heat sink fluid during the burn-in procedure.

12. The heat sink of claim 11, wherein said heat sink interface area micro-channels are defined by a roughness of the essentially flat heat sink interface surface of about 0.5 micron Ra.

13. The heat sink of claim 12, wherein the liquid feed inlet assembly further comprises an assist element configured to enhance continuous flow of the heat sink liquid transported from the liquid feed inlet assembly through the at least one liquid opening and channeled across and into contact with the surface of the integrated circuit chip though the integrated circuit chip and interface area micro-channels away into the liquid recovery channel and conveyed to the liquid outlet through the at least one liquid recovery path.

14. The heat sink of claim 13, wherein the assist element is a vacuum assist element or a compressed air-assist element.

15. The heat sink of claim 14, wherein the heat sink fluid is chosen from the group consisting of water, a polyvinyl alcohol, and a mixture of water and the polyvinyl alcohol.

16. The heat sink of claim 14 wherein the heat sink fluid is a polyalphaolefin oil comprising a stability-enhancing amount of [1,3,5-trimethyl-2,4,6-tris(3,5-di-tert-butyl-4-hydroxybenzyl)benzene] in an amount of about 0.16 to about 0.4%.

17. The heat sink of claim 16 wherein the heat sink fluid is a combination of a hindered phenol and an aromatic phosphite antioxidant.

18. The heat sink of claim 17 wherein the hindered phenol is [tetrakis-(methylene-3,5-di-tert-butyl-hydroxy-hydrocinnamate)methane]; and
    wherein the aromatic phosphite is tris(2,4-di-tert-butyl phenyl)phosphate.

19. The heat sink of claim 18 wherein the heat sink fluid further contains an aminic antioxidant.

20. The heat sink of claim 19 wherein the aminic antioxidant is an alkylated amine.

* * * * *